United States Patent
Liu et al.

(10) Patent No.: US 12,291,770 B2
(45) Date of Patent: May 6, 2025

(54) MASK, MANUFACTURING METHOD OF MASK, AND MANUFACTURING METHOD OF DISPLAY PANEL

(71) Applicant: KUNSHAN GO-VISIONOX OPTO-ELECTRONICS CO., LTD, Jiangsu (CN)

(72) Inventors: Mingxing Liu, Kunshan (CN); Shuaiyan Gan, Kunshan (CN); Weili Li, Kunshan (CN); Bing Han, Kunshan (CN)

(73) Assignee: KUNSHAN GO-VISIONOX OPTO-ELECTRONICS CO., LTD, Kunshan (CN)

( * ) Notice: Subject to any disclaimer, the term of this patent is extended or adjusted under 35 U.S.C. 154(b) by 673 days.

(21) Appl. No.: 17/519,006

(22) Filed: Nov. 4, 2021

(65) Prior Publication Data
US 2022/0056574 A1 Feb. 24, 2022

Related U.S. Application Data

(63) Continuation of application No. PCT/CN2020/104734, filed on Jul. 27, 2020.

(30) Foreign Application Priority Data

Oct. 17, 2019 (CN) .......................... 201910989459.1

(51) Int. Cl.
*C23C 14/04* (2006.01)
*C23C 14/24* (2006.01)
(Continued)

(52) U.S. Cl.
CPC ............ *C23C 14/042* (2013.01); *C23C 14/24* (2013.01); *H10K 71/166* (2023.02); *H10K 71/00* (2023.02)

(58) Field of Classification Search
None
See application file for complete search history.

(56) References Cited

U.S. PATENT DOCUMENTS 4,636,285 A 1/1987 Tarumoto et al.
7,241,664 B2 * 7/2007 Kobayashi ............ G03F 9/7076
257/E23.179

(Continued)

FOREIGN PATENT DOCUMENTS

CN 104062842 A 9/2014
CN 105568217 A 5/2016
(Continued)

OTHER PUBLICATIONS

Machine Eng. Translation of JP-2004 218033; 2004 (Year: 2004).*
(Continued)

*Primary Examiner* — Shamim Ahmed
(74) *Attorney, Agent, or Firm* — Maier & Maier, PLLC

(57) ABSTRACT

The mask includes a first surface and a second surface that are arranged opposite to each other. The first surface includes a plurality of first grooves, the second surface includes a plurality of second grooves, the plurality of second grooves and the plurality of first grooves are in a one-to-one correspondence, and each second groove and a respective first groove corresponding to the each second groove penetrate the mask. On the second surface, the distance between adjacent second grooves is greater than a preset distance, where the preset distance is greater than zero.

12 Claims, 5 Drawing Sheets

(51) Int. Cl.
 H01L 51/00 (2006.01)
 H10K 71/16 (2023.01)
 H10K 71/00 (2023.01)

(56) References Cited

U.S. PATENT DOCUMENTS

| | | | | |
|---|---|---|---|---|
| 7,354,864 | B2* | 4/2008 | Shimoji | H01L 29/0657 |
| | | | | 257/E29.022 |
| 7,387,739 | B2* | 6/2008 | Yotsuya | C23C 14/042 |
| | | | | 430/5 |
| 11,714,353 | B2* | 8/2023 | Qu | G03F 7/2018 |
| | | | | 430/5 |
| 2014/0209025 | A1* | 7/2014 | Han | C23C 14/04 |
| | | | | 118/721 |
| 2019/0292647 | A1* | 9/2019 | Liu | C23C 14/042 |

FOREIGN PATENT DOCUMENTS

| | | |
|---|---|---|
| CN | 107797376 A | 3/2018 |
| CN | 207918940 A | 9/2018 |
| CN | 108611592 A | 10/2018 |
| CN | 108611593 A | 10/2018 |
| CN | 108642440 A | 10/2018 |
| CN | 108666420 A | 10/2018 |
| CN | 108735915 A | 11/2018 |
| CN | 108796438 A | 11/2018 |
| CN | 110699637 A | 1/2020 |
| EP | 3514844 Y | 7/2019 |
| GB | 1468298 A | 3/1977 |
| JP | 7-272622 A * | 10/1995 |
| JP | 2003100583 A | 4/2003 |
| JP | 2004218033 A * | 8/2004 |
| JP | 2018053345 A | 4/2018 |
| KR | 20070002553 A | 1/2007 |

OTHER PUBLICATIONS

Machine Eng. Translation of H07272622 a (Jp 7-272622)' 1995. (Year: 1995).*
International Search Report issued on Oct. 13, 2020 in corresponding International Application No. PCT/CN2020/104734; 4 pages.
First Search issued on Sep. 21, 2020 in corresponding Chinese Application No. 201910989459.1; 2 pages.
First Office Action issued on Sep. 25, 2020 in corresponding Chinese Application No. 201910989459.1; 18 pages.
Second Office Action issued on Dec. 4, 2020 in corresponding Chinese Application No. 201910989459.1; 14 pages.
Supplementary Search issued on Feb. 8, 2021 in corresponding Chinese Application No. 201910989459.1; 2 pages.

* cited by examiner

MASK, MANUFACTURING METHOD OF MASK, AND MANUFACTURING METHOD OF DISPLAY PANEL

CROSS-REFERENCE TO RELATED APPLICATION(S)

This is a continuation of International Patent Application No. PCT/CN2020/104734, filed on Jul. 27, 2020, which claims priority to Chinese Patent Application No. 201910989459.1 filed with the CNIPA on Oct. 17, 2019, the disclosure of which is incorporated herein by reference in their entireties.

TECHNICAL FIELD

Embodiments of the present application relate to the field of display technologies, for example, to a mask, a manufacturing method of a mask, and a manufacturing method of a display panel.

BACKGROUND

In the process of manufacturing the mask, with the increase of pixels per inch (PPI), openings on the mask become denser and the distance between adjacent openings becomes smaller. When the openings are formed by etching the mask, it is difficult to control the etching speed so that the residual thickness of the mask between openings is inconsistent, and the strength of the mask is relatively poor.

SUMMARY

The present application provides a mask, a manufacturing method of a mask, and a manufacturing method of a display panel so that the strength and service life of the mask can be improved.

Embodiments of the present application provide a manufacturing method of a mask. The method includes the steps described below.

A first substrate is provided, where the first substrate includes a first surface and a second surface that are arranged opposite to each other.

The first surface is etched so that multiple first grooves are formed.

The second surface is etched to form multiple third grooves, where the multiple third grooves and the multiple first grooves are in a one-to-one correspondence, and an opening area of each third groove is greater than an opening area of each first groove; on the second surface, a distance between adjacent third grooves is greater than a preset distance, where the preset distance is greater than zero.

A protective layer is applied on an edge area of a side surface of each third groove closer to the second surface.

The third grooves are etched to form second grooves, where a depth of each second groove is greater than a depth of each third groove, and the second grooves and the first grooves penetrate the first substrate.

The protective layer is removed.

Embodiments of the present application provide a mask. The mask includes a first surface and a second surface that are arranged opposite to each other, where the first surface includes multiple first grooves, the second surface includes multiple second grooves, the multiple second grooves and the multiple first grooves are in a one-to-one correspondence, and each second groove and a respective first groove corresponding to the each second groove penetrate the mask.

On the second surface, a distance between adjacent second grooves is greater than a preset distance, where the preset distance is greater than zero.

Embodiments of the present application provide a manufacturing method of a display panel. The method includes the steps described below.

A second substrate is provided.

A light-emitting layer is formed on the second substrate, where the light-emitting layer is formed by evaporating the mask provided in any embodiment of the present application.

According to the technical solution of embodiments of the present disclosure, third grooves are formed on the second surface of the first substrate first, the protective layer is applied on the edge area of the side surface of each third groove closer to the second surface, the third grooves are etched to form second grooves, and the second grooves and the first grooves penetrate the first substrate. Since the depth of the third groove is less than the depth of the second groove, the etching time of the third groove is less than the etching time of the second groove so that the distance between the third grooves is more controllable, and it is ensured that the distance between the third grooves is greater than the preset distance. Moreover, in the case where the third grooves are etched to form the second grooves, since the protective layer is applied on the edge area of the side surface of each third groove closer to the second surface, the etchant may be prevented from further etching the edge area of the side surface of each third groove closer to the second surface during the process of forming the second grooves. In this manner, it is ensured that the distance between the second grooves is equal to the distance between the third grooves, that is, it is ensured that the distance between the grooves formed on the second surface of the mask is greater than the preset distance, the uniformity of the residual thickness between adjacent grooves is ensured, and the mask strength between adjacent grooves is ensured so that the strength of the mask is improved, and thus the service life of the mask is improved.

DETAILED DESCRIPTION

Figure 1:
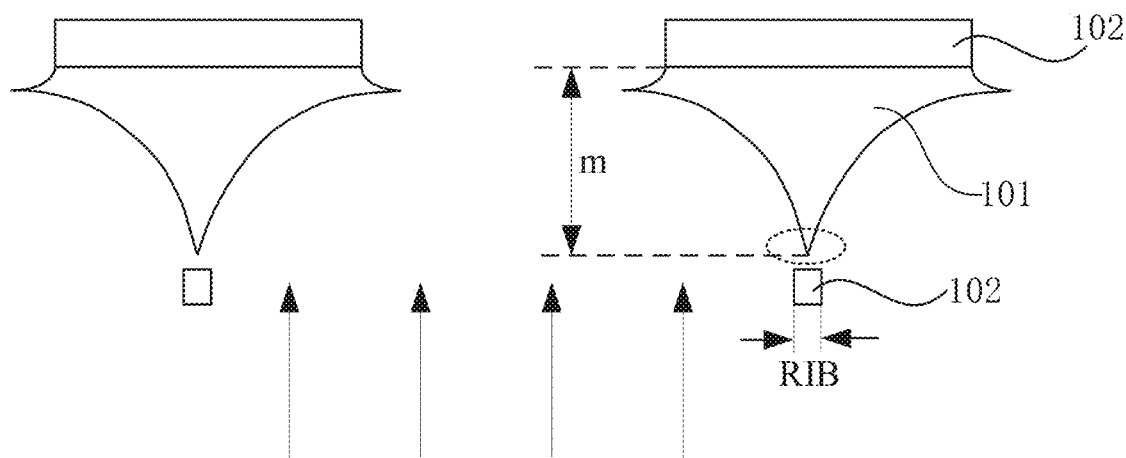
FIG. 1 is a schematic diagram of an etching process of a mask.

The present application is described hereinafter in conjunction with drawings and embodiments. The embodiments described herein are intended to explain the present application. In addition, for ease of description, only part, not all, of structures related to the present application are illustrated in the drawings.

In the process of manufacturing an organic light-emitting diode (OLED) display panel, in the case where a light-emitting layer of the OLED device is evaporated, light-emitting materials of different colors are evaporated separately by using precision masks. As the PPI on the OLED display panel increases, openings in a one-to-one correspondence with the sub-pixels on the mask become denser, and the distance between adjacent openings on the mask surface becomes smaller, that is, the distance (RIB) between adjacent openings becomes narrower. In the present application, RIB denotes the distance between adjacent openings.

FIG. 1 is a schematic diagram of an etching process of a mask. As shown in FIG. 1, in the process of manufacturing a mask 101, photoresist 102 is applied on non-opening positions on an upper surface and a lower surface of the mask 101, and the opening on the lower surface is greater than the opening on the upper surface. Since the RIB between adjacent openings on the lower surface is relatively small, during the etching process, the mask between adjacent openings is easily etched by the etchant in the adjacent openings at the same time, which easily leads to the RIB between adjacent openings being zero. In this manner, a thickness m of the mask between adjacent openings is less than an original thickness of the mask so that the strength of the mask is relatively poor. The thickness m of the mask between adjacent openings may be expressed by a residual thickness. A reflow of the etchant in adjacent openings is formed on the surface of the mask corresponding to the residual thickness, and the etching of the mask at the residual thickness is accelerated. It is difficult to control the etching speed so that it is difficult to control the residual thickness of the mask between adjacent openings. In this manner, the uniformity of the residual thickness of the mask between adjacent openings is relatively poor, and thus the strength of the mask is further reduced.

Figure 2:
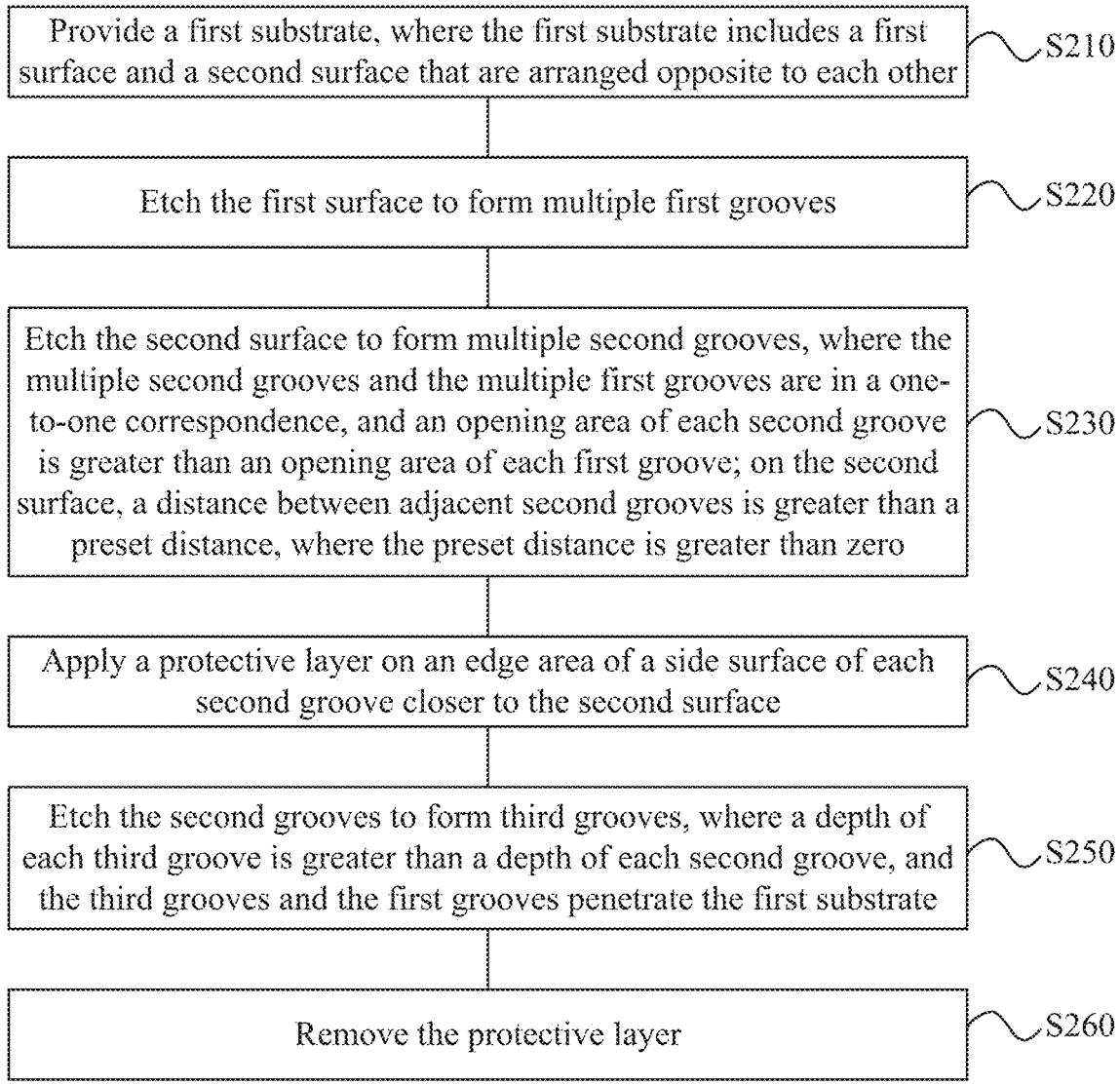
FIG. 2 is a flowchart of a manufacturing method of a mask according to an embodiment of the present application.

In view of the preceding technical problems, embodiments of the present application provide a manufacturing method of a mask. FIG. 2 is a flowchart of a manufacturing method of a mask according to an embodiment of the present application. As shown in FIG. 2, the manufacturing method includes the steps described below.

In S210, a first substrate is provided, where the first substrate includes a first surface and a second surface that are arranged opposite to each other.

Figure 3:
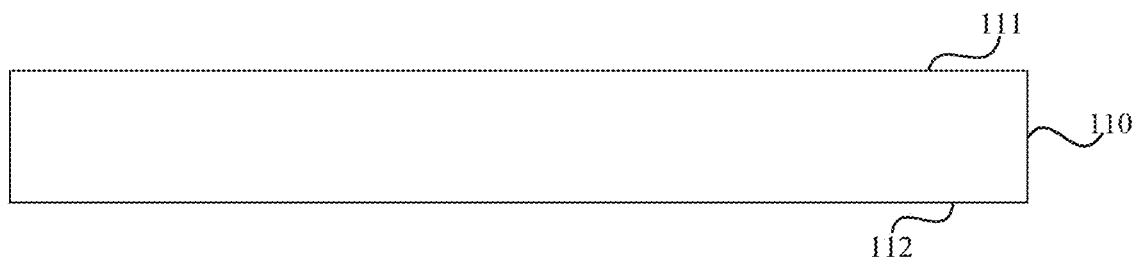
FIG. 3 is a structural diagram of the mask corresponding to step S210 of the manufacturing method of a mask according to an embodiment of the present application.

FIG. 3 is a structural diagram of the mask corresponding to step S210 of the manufacturing method of a mask according to an embodiment of the present application. As shown in FIG. 3, a first substrate 110 includes a first surface 111 and a second surface 112. The first substrate 110 may be a metal plate.

In S220, the first surface is etched to form multiple first grooves.

Figure 4:
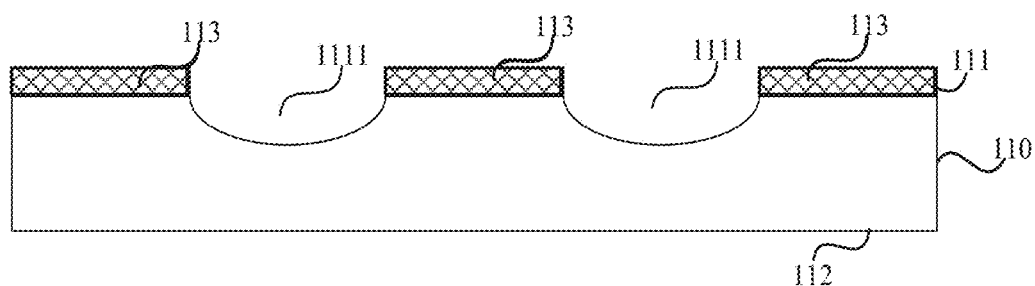
FIG. 4 is a structural diagram of the mask corresponding to step S220 of the manufacturing method of a mask according to an embodiment of the present application.

FIG. 4 is a structural diagram of the mask corresponding to step S220 of the manufacturing method of a mask according to an embodiment of the present application. As shown in FIG. 4, the first surface 111 includes multiple first grooves 1111, and each first groove 1111 may correspond to a position where an evaporation layer is disposed in an evaporation structure. Exemplarily, in the case where the light-emitting layer is evaporated on the OLED display panel through the mask, the first grooves 1111 and the sub-pixels in the OLED display panel may be in a one-to-one correspondence.

Figure 5:
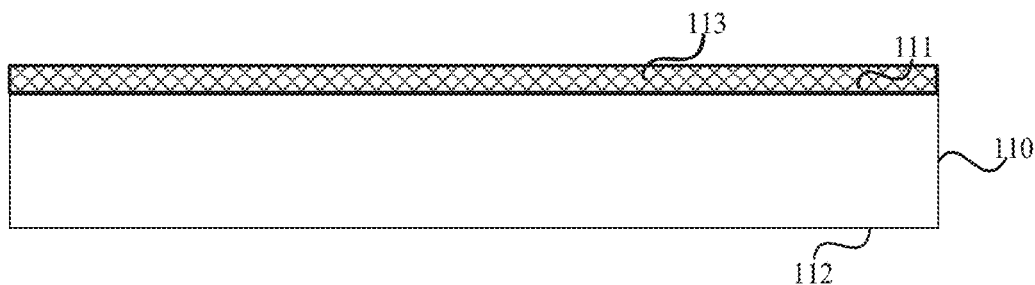
FIG. 5 is a structural diagram of the first surface of the mask on which photoresist is applied in the manufacturing method of a mask according to an embodiment of the present application.
Figure 6:
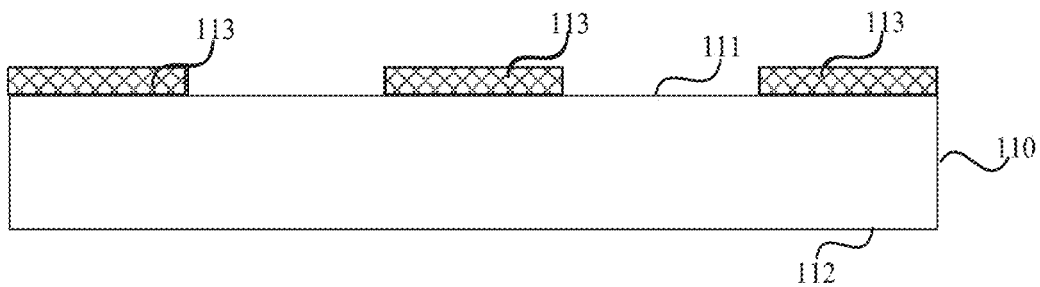
FIG. 6 is a structural diagram of the patterned photoresist on the first surface of the mask in the manufacturing method of a mask according to an embodiment of the present application.

In an embodiment, the first surface 111 may be etched by using a photolithography process to form the first grooves 1111. FIG. 5 is a structural diagram of the first surface of the mask on which photoresist is applied in the manufacturing method of a mask according to an embodiment of the present application. FIG. 6 is a structural diagram of the patterned photoresist on the first surface of the mask in the manufacturing method of a mask according to an embodiment of the present application. Referring to FIGS. 4 to 6, the process of forming the first grooves 1111 may include: applying photoresist 113 on the first surface 111, patterning the photoresist 113, and removing photoresist 113 at the first grooves 1111 corresponding to the first surface 111. The photoresist 113 may be patterned by using the photolithography process. Finally, the first surface 111 without the photoresist 113 is etched, by using the etchant, to form the first grooves 1111.

In S230, the second surface is etched to form multiple third grooves, where the multiple third grooves and the multiple first grooves are in a one-to-one correspondence, and an opening area of each third groove is greater than an opening area of each first groove; on the second surface, a distance between adjacent third grooves is greater than a preset distance, where the preset distance is greater than zero.

Figure 7:
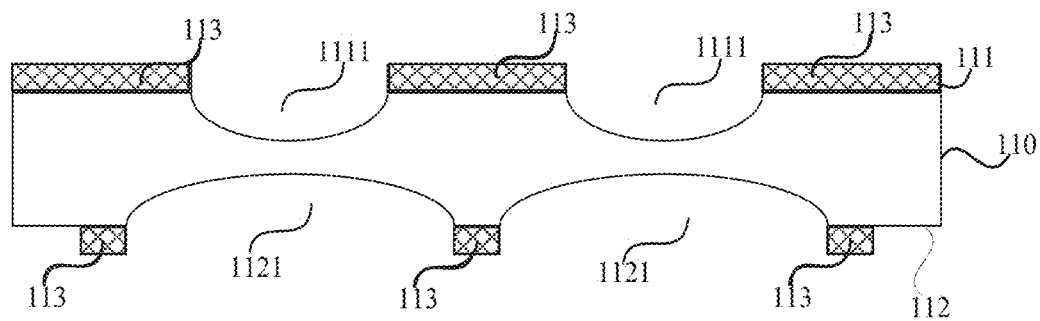
FIG. 7 is a structural diagram of the mask corresponding to step S230 of the manufacturing method of a mask according to an embodiment of the present application.

In an embodiment, in the case where the mask is used for evaporation, the opening on the surface adjacent to an evaporation source is greater than the opening on the surface adjacent to an evaporated structure so that during the evaporation process, while the evaporation accuracy is ensured, the organic material in the evaporation source is likely to fall into the opening on the surface adjacent to the evaporation source. FIG. 7 is a structural diagram of the mask corresponding to step S230 of the manufacturing method of a mask according to an embodiment of the present application. As shown in FIG. 7, the opening area of the third groove 1121 on the second surface 112 is greater than the opening area of the first groove 1111. In the case where the mask is used for evaporation, the first surface 111 is adjacent to the evaporated structure, and the second surface 112 is adjacent to the evaporation source.

Optionally, the step of etching the second surface to form multiple third grooves includes: applying photoresist on the second surface; patterning the photoresist; etching the second surface by using a wet etching process to form the multiple third grooves.

The opening areas of the patterned photoresist 113 and the first grooves 1111 are in a one-to-one correspondence. The second surface 112 is etched by using the wet etching process, that is, the second surface 112 is etched by the etchant to form multiple third grooves 1121. Since the wet etching process is relatively simple and the cost is relatively low, the first grooves 1111 and the third grooves 1121 are both formed by using the wet etching process so that the process difficulty and process cost of forming the mask can be reduced.

The preset distance is the minimum distance between adjacent openings that needs to be satisfied to ensure the mask strength in the case where the opening density and the opening size of the mask are fixed. The distance between adjacent third grooves 1121 may be set according to the opening density and the opening size of the mask. The greater the opening density of the mask is, the greater the opening size is, the smaller the distance between adjacent third grooves 1121 is.

In S240, a protective layer is applied on an edge area of a side surface of each third groove closer to the second surface.

Figure 8:
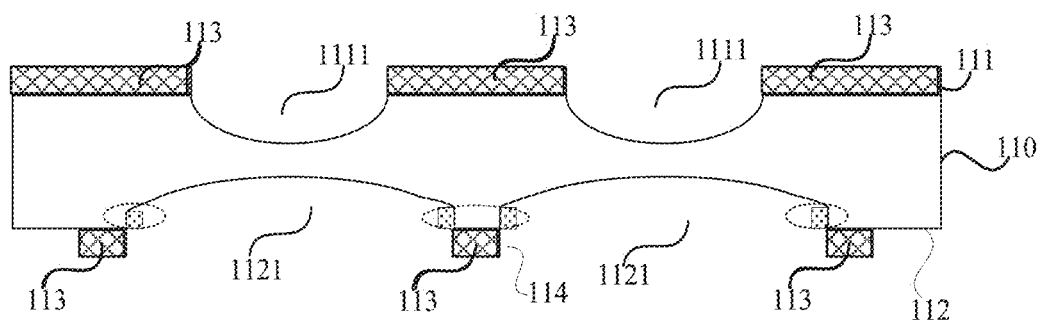
FIG. 8 is a structural diagram of the mask corresponding to step S240 of the manufacturing method of a mask according to an embodiment of the present application.

FIG. 8 is a structural diagram of the mask corresponding to step S240 of the manufacturing method of a mask according to an embodiment of the present application. As shown in FIG. 8, before the third grooves 1121 are continued to be etched, the edge area (the dotted line area in FIG. 8) of the side surface of each third groove 1121 closer to the second surface 112 is coated with a protective layer 114. In this embodiment, the protective layer 114 is used for isolating the edge area of the side surface of each third groove 1121 closer to the second surface 112 from the etchant so that the etchant is prevented from etching this area. Exemplarily, the protective layer 114 may be photoresist, so the protective layer 114 may be applied by using the process of applying the photoresist 113, no new process needs to be added, and no new material needs to be added so that the manufacturing cost of the mask can be reduced. The protective layer 114 may also be made of other materials that can isolate the side surface of each third groove 1121 from the etchant.

In S250, the third grooves are etched to form second grooves, where a depth of each second groove is greater than a depth of each third groove, and the second grooves and the first grooves penetrate the first substrate.

Figure 9:
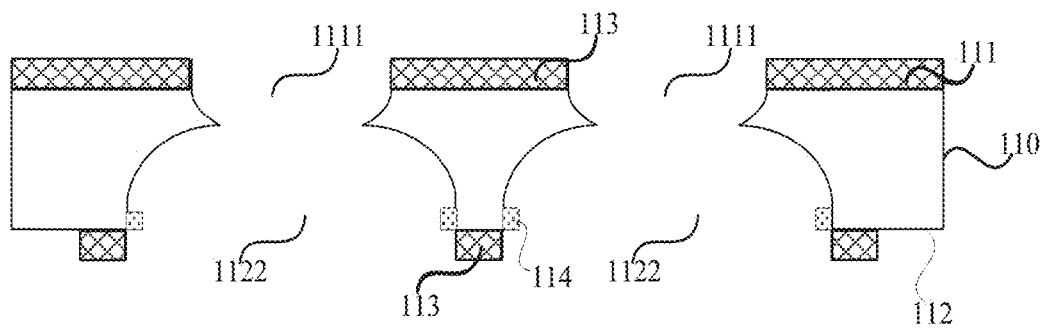
FIG. 9 is a structural diagram of the mask corresponding to step S250 of the manufacturing method of a mask according to an embodiment of the present application.

FIG. 9 is a structural diagram of the mask corresponding to step S250 of the manufacturing method of a mask according to an embodiment of the present application. As shown in FIG. 9, the third grooves 1121 are etched to form second grooves 1122 so that penetrating grooves are formed between the first surface 111 and the second surface 112 of the mask, and thus openings are formed.

In conjunction with FIGS. 8 and 9, since the depth of the third groove 1121 is less than the depth of the second groove 1122, the etching time of the third groove 1121 is less than the etching time of the second groove 1122 so that the distance between the third grooves 1121 is more controllable, and it is ensured that the distance between the third grooves 1121 is greater than the preset distance. Moreover, in the case where the third grooves 1121 are etched to form the second grooves 1122, since the protective layer 114 is applied on the edge area of the side surface of each third groove 1121 closer to the second surface 112, the etchant may be prevented from further etching the edge area of the side surface of each third groove 1121 closer to the second surface 112 during the process of forming the second grooves 1122. In this manner, it is ensured that the distance between the second grooves 1122 is equal to the distance between the third grooves 1121, that is, it is ensured that the distance between the grooves formed on the second surface 112 of the mask is greater than the preset distance, and the mask strength between adjacent grooves is ensured so that the strength of the mask is improved, and the uniformity of the residual thickness between adjacent grooves is ensured. Therefore, the strength of the mask is further improved, and thus the service life of the mask is improved.

Optionally, the step of etching the third grooves to form the second grooves includes etching the third grooves by using the wet etching process to form the second grooves.

The third grooves 1121 are etched by using the wet etching process, the process of etching the third grooves 1121 is the same as the process of etching the second surface 112 so that the process cost of forming the second grooves 1122 can be reduced.

In S260, the protective layer is removed.

Figure 10:
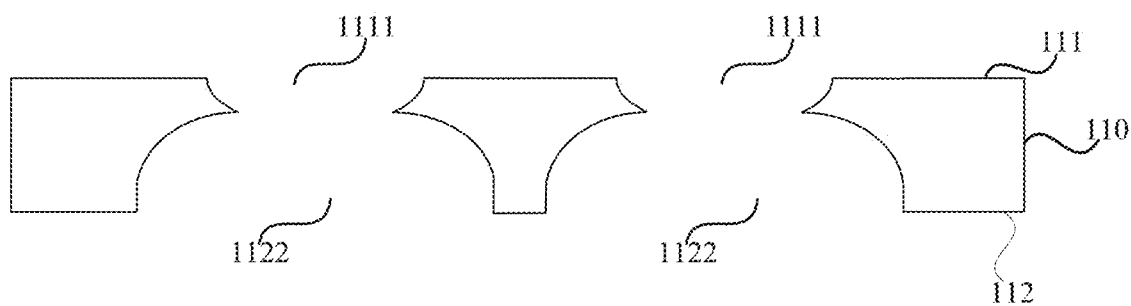
FIG. 10 is a structural diagram of the mask corresponding to step S260 of the manufacturing method of a mask according to an embodiment of the present application.

FIG. 10 is a structural diagram of the mask corresponding to step S260 of the manufacturing method of a mask according to an embodiment of the present application. As shown in FIG. 10, after the protective layer 114 is removed, the obtained mask has a relatively strong strength, and at the same time, the thickness of the mask between adjacent openings can be ensured to be consistent so that the uniformity of the thickness of the mask is improved.

When the protective layer 114 is removed, the photoresist 113 remaining on the first surface 111 and the second surface 112 may be removed simultaneously.

According to the technical solution of this embodiment, the third grooves are formed on the second surface of the first substrate first, the protective layer is applied on the edge area of the side surface of each third groove closer to the second surface, the third grooves are etched to form the second grooves, and the second grooves and the first grooves penetrate the first substrate. Since the depth of the third groove is less than the depth of the second groove, the etching time of the third groove is less than the etching time of the second groove so that the distance between the third grooves is more controllable, and it is ensured that the distance between the third grooves is greater than the preset distance. Moreover, in the case where the third grooves are etched to form the second grooves, since the protective layer is applied on the edge area of the side surface of each third groove closer to the second surface, the etchant may be prevented from further etching the edge area of the side surface of each third groove closer to the second surface during the process of forming the second grooves. In this manner, it is ensured that the distance between adjacent second grooves is equal to the distance between adjacent third grooves, that is, it is ensured that the distance between the grooves formed on the second surface of the mask is greater than the preset distance, the uniformity of the residual thickness between adjacent grooves is ensured, and the mask strength between adjacent grooves is ensured so that the strength of the mask is improved, and thus the service life of the mask is improved.

Figure 11:
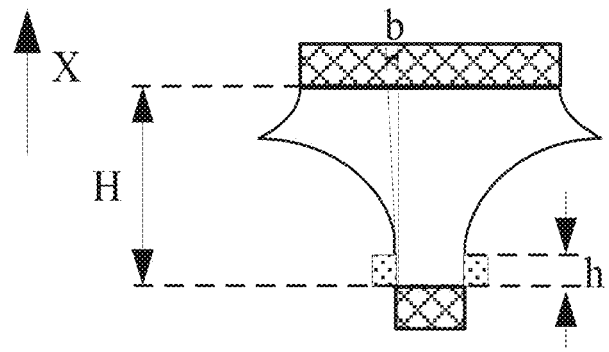
FIG. 11 is a structural diagram of an intermediate structure adjacent to a second groove of the mask according to an embodiment of the present application.

Based on the preceding technical solution, FIG. 11 is a structural diagram of an intermediate structure adjacent to the second groove according to an embodiment of the present application. As shown in FIGS. 9 to 11, the width h of the photoresist applied on the edge area of the side surface of each third groove 1121 closer to the second surface 112 along the thickness direction X of the first substrate 110 is greater than $1/10$ of the thickness H of the first substrate 110 and less than $1/3$ of the thickness H of the first substrate 110.

The photoresist is applied on the edge area of the side surface of each third groove 1121 closer to the second surface 112 so that the mask strength can be ensured when the second grooves 1122 are formed by etching. In the case where the width h of the photoresist applied on the edge area of the side surface of each third groove 1121 closer to the second surface 112 is relatively small, the area protecting the side surface of each third groove 1121 is relatively small; in the case where the third grooves 1121 are etched to form the second grooves 1122, it is easy to form a concave structure on the side surface of each third groove 1121 so that the mask strength is reduced. In the case where the width h of the photoresist applied on the edge area of the side surface of each third groove 1121 closer to the second surface 112 is relatively great, the angle between the part of the side surface of each third groove 1121 closer to the bottom of the third groove 1121 and the part adjacent to the second surface 112 is relatively great, the process is relatively difficult when the protective layer 114 is applied. Moreover, in the case where etching is performed to form the second grooves 1122, it is easy to form a convex structure on the side surface of each second groove 1122, which is not conducive to the evaporation rate and deposition effect of the organic material in the case where the mask is used for evaporation.

The width h of the photoresist applied on the edge area of the side surface of each third groove 1121 closer to the second surface 112 is greater than 1/10 of the thickness H of the first substrate 110 and less than 1/3 of the thickness H of the first substrate 110 so that while the mask strength is ensured, it is ensured that the evaporation rate and deposition effect of the organic material can satisfy the requirements in the case where the mask is used for evaporation.

With continued reference to FIGS. 8 to 11, on the second surface 112, the angle b between the surface tangent of the edge area of the side surface of each third groove 1121 closer to the second surface 112 and the first direction X is less than or equal to 10°, where the first direction X is the thickness direction of the first substrate 110.

In the case where the angle b between the surface tangent of the edge area of the side surface of each third groove 1121 closer to the second surface 112 and the first direction X is relatively small, the angle between the surface tangent of the edge area of the side surface of each second groove 1122 closer to the second surface 112 and the first direction X is relatively small In this manner, the side surface of each second groove 1122 can be prevented from being concave or convex in the case where the third grooves 1121 are etched to form the second grooves so that the mask strength is ensured, and the service life of the mask can be improved while the convex structure can be prevented from affecting the passage of the organic material during evaporation. In the case where the angle b between the surface tangent of the edge area of the side surface of each third groove 1121 closer to the second surface 112 and the first direction X is less than or equal to 10°, the convex structure can be prevented from being formed on the side surface of each second groove 1122, and thus the passage of the evaporation material is not affected while the mask has a relatively high strength and the service life of the mask is improved.

Optionally, the angle b between the surface tangent of the edge area of the side surface of each third groove 1121 closer to the second surface 112 and the first direction X is less than or equal to 5°. Within this range, after the third grooves 1121 are etched so that the second grooves 1122 are formed, the side surface of each second groove 1122 can be better prevented from being concave or convex so that while the mask strength can be better ensured, the passage of the organic material is not affected during evaporation.

The angle between the edge area of the side surface of each third groove 1121 closer to the second surface 112 and the first direction X may be controlled by controlling the concentration of the etchant used for etching the third grooves 1121 and the etching time.

Embodiments of the present application further provide a mask. With continued reference to FIG. 10, the mask includes a first surface 111 and a second surface 112 that are arranged opposite to each other; the first surface 111 includes multiple first grooves 1111, the second surface 112 includes multiple second grooves 1122, the multiple second grooves 1122 and the multiple first grooves 1111 are in a one-to-one correspondence, and each second groove 1122 and a respective first groove 1111 corresponding to the each second groove 1122 penetrate the mask; on the second surface 112, the distance between adjacent second grooves 1122 is greater than a preset distance, where the preset distance is greater than zero.

The distance between adjacent second grooves 1122 on the second surface 112 is greater than the preset distance. In this manner, the mask strength between adjacent second grooves 1122 on the second surface 112 can be ensured, and the uniformity of the residual thickness between adjacent second grooves 1122 on the second surface 112 can be ensured so that the mask strength can be improved, and thus the service life of the mask can be improved.

Based on the preceding technical solution, on the second surface, the angle between the surface tangent of the edge area of the side surface of each second groove 1122 closer to the second surface and the first direction is less than or equal to 10°, where the first direction is the thickness direction of the mask.

The angle between the surface tangent of the edge area of the side surface of each second groove 1122 closer to the second surface 112 and the first direction is less than or equal to 10° so that the mask strength can be improved, and the service life of the mask can be improved. In an embodiment, the angle between the surface tangent of the edge area of the side surface of each second groove 1122 closer to the second surface and the first direction is less than or equal to 5°.

Similarly, along the first direction, the width of the edge area of the side surface of each second groove 1122 closer to the second surface 112 is greater than 1/10 of the thickness of the mask and less than 1/3 of the thickness of the mask. In this manner, while the mask strength is ensured, it is ensured that the evaporation rate and deposition effect of the organic material can satisfy the requirements in the case where the mask is used for evaporation.

Figure 12:
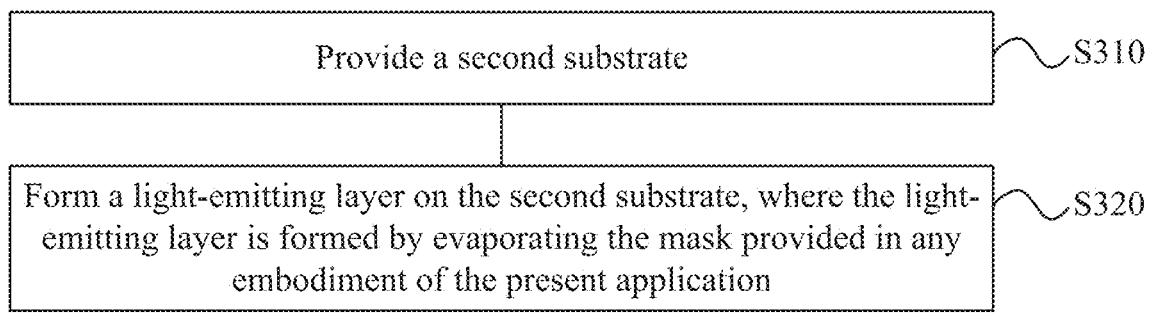
FIG. 12 is a flowchart of a manufacturing method of a mask according to an embodiment of the present application.

Embodiments of the present application further provide a manufacturing method of a mask. FIG. 12 is a flowchart of a manufacturing method of a mask according to an embodiment of the present application. As shown in FIG. 12, the method includes the steps described below.

In S310, a second substrate is provided.

The second substrate may include a base substrate and drive circuits formed on the base substrate. The drive circuits and the OLEDs in the display panel are in a one-to-one correspondence, and the drive circuits are configured to drive the OLEDs to emit light.

In S320, a light-emitting layer is formed on the second substrate, where the light-emitting layer is formed by evaporating the mask provided in any embodiment of the present application.

In an embodiment, each OLED includes a light-emitting layer, and the light-emitting layer is configured to emit light under the action of current. The light-emitting materials in the light-emitting layer of OLEDs of different colors are different. Therefore, the light-emitting materials are evaporated separately by using the evaporation masks so that the following case can be avoided: mixed evaporation of the light-emitting materials in the light-emitting layer of OLEDs of different colors occurs, resulting in color crosstalk. In the case where the light-emitting layer is evaporated by using the mask provided in any embodiment of the present application, since the mask has a relatively high intensity, the mask is stretched by the jaws during the evaporation process so that the deformation of the mask during the process of aligning the openings of the mask to the positions on which the light-emitting materials need to be evaporated in the OLED is relatively small In this manner, the alignment accuracy of the mask during the evaporation process can be improved, and thus the risk that the mixed evaporation of the light-emitting materials of OLEDs of different colors causes the color deviation and color mixing can be reduce.

What is claimed is:

1. A manufacturing method of a mask, comprising:
providing a first substrate, wherein the first substrate comprises a first surface and a second surface that are arranged opposite to each other;
etching the first surface to form a plurality of first grooves;
etching the second surface to form a plurality of third grooves, wherein the plurality of third grooves and the plurality of first grooves are in a one-to-one correspondence, and an opening area of each of the plurality of third grooves is greater than an opening area of each of the plurality of first grooves; on the second surface, a distance between adjacent ones of the plurality of third grooves is greater than a preset distance, wherein the preset distance is greater than zero;
applying a protective layer on an edge area of a side surface of each of the plurality of third grooves closer to the second surface;, wherein on the second surface, an angle between a surface tangent of the edge area of the side surface of each of the plurality of third grooves closer to the second surface and a first direction is less than or equal to 10°, wherein the first direction is a thickness direction of the mask;
etching the plurality of third grooves to form second grooves, wherein a depth of each of the second grooves is greater than a depth of each of the plurality of third grooves, and the second grooves and the plurality of first grooves penetrate the first substrate; and
removing the protective layer.

2. The method of claim 1, wherein the protective layer is photoresist;
and the first substrate is a metal plate.

3. The method of claim 1, wherein a width of the protective layer applied on the edge area of the side surface of each of the plurality of third grooves closer to the second surface along a thickness direction of the first substrate is greater than $1/10$ of a thickness of the first substrate and less than $1/3$ of the thickness of the first substrate.

4. The method of claim 1, wherein the angle between the surface tangent of the edge area of the side surface of each of the plurality of third grooves closer to the second surface and the first direction is less than or equal to 5°.

5. The method of claim 1, wherein etching the second surface to form the plurality of third grooves comprises:
applying photoresist on the second surface;
patterning the photoresist;
etching the second surface by using a wet etching process to form the plurality of third grooves; and
retaining the photoresist on the second surface, till after etching the plurality of third grooves to form second grooves, removing the photoresist on the second surface.

6. The method of claim 5, wherein etching the plurality of third grooves to form the second grooves further comprises:
etching the plurality of third grooves by using the wet etching process to form the second grooves.

7. The method of claim 5, wherein opening areas of the patterned photoresist and the plurality of first grooves are in a one-to-one correspondence.

8. The method of claim 1, wherein the distance between adjacent ones of the plurality of third grooves is determined according to an opening density and an opening size of the mask.

9. The method of claim 5, wherein the protective layer is photoresist; the etching the first surface to form the plurality of first grooves comprises:
applying photoresist on the first surface;
patterning the photoresist; and
etching the first surface by using the wet etching process to form the plurality of first grooves; the removing the protective layer comprises:
removing the protective layer, the photoresist on the first surface, and the photoresist on the second surface simultaneously.

10. The method of claim 1, wherein the surface tangent of the edge area of the side surface of each of the plurality of third grooves closer to the second surface comprises the surface tangent of a side of the edge area away from the second surface.

11. The method of claim 1, wherein a side surface of each second groove is arranged smooth and curved.

12. The method of claim 11, wherein the side surface of each second groove is not arranged with a concave structure and a convex structure.

* * * * *